(12) United States Patent
Lorin

(10) Patent No.: US 12,158,483 B2
(45) Date of Patent: Dec. 3, 2024

(54) MAINS MONITORING

(71) Applicant: STMicroelectronics (Grenoble 2) SAS, Grenoble (FR)

(72) Inventor: Christophe Lorin, Montbonnot (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 142 days.

(21) Appl. No.: 18/053,974

(22) Filed: Nov. 9, 2022

(65) Prior Publication Data
US 2023/0176093 A1 Jun. 8, 2023

(30) Foreign Application Priority Data
Dec. 3, 2021 (FR) ...................................... 2112953

(51) Int. Cl.
*G01R 15/14* (2006.01)
*G01R 1/20* (2006.01)
*G01R 27/14* (2006.01)

(52) U.S. Cl.
CPC ........... *G01R 15/146* (2013.01); *G01R 1/203* (2013.01); *G01R 27/14* (2013.01)

(58) Field of Classification Search
CPC .. G01R 1/203; G01R 15/146; G01R 19/2513; G01R 27/14
USPC ....................................................... 361/93.7
See application file for complete search history.

(56) References Cited

U.S. PATENT DOCUMENTS

| | | |
|---|---|---|
| 10,181,787 B2 | 1/2019 | Chan |
| 10,634,705 B2 | 4/2020 | Almosnino |
| 2016/0258984 A1 | 9/2016 | Meehleder |
| 2018/0080960 A1* | 3/2018 | Almosnino ...... G01R 19/16533 |
| 2018/0287488 A1* | 10/2018 | Chan .................. H02M 1/4225 |
| 2019/0165566 A1* | 5/2019 | Stauffer ................. H02H 3/253 |
| 2020/0110124 A1* | 4/2020 | Schweitzer, III .... G01R 31/085 |

* cited by examiner

*Primary Examiner* — Kevin J Comber
(74) *Attorney, Agent, or Firm* — Slater Matsil, LLP

(57) ABSTRACT

In accordance with an embodiment, an integrated circuit chip includes a first input configured to receive a rectified potential and a second input configured to receive a reference potential; a first circuit configured to maintain the rectified potential at a constant value on the first input; a second circuit having a power supply input coupled to the first node; a first resistor series-connected to the first circuit between the second input and the first node, or connected between the first input and the first node; a third circuit connected across the first resistor and configured to deliver a signal which is an image of a current in the first resistor; and a fourth circuit configured to determine a mains frequency and/or a mains voltage based at least on the signal which is the image of the current in the first resistor.

20 Claims, 2 Drawing Sheets

MAINS MONITORING

CROSS-REFERENCE TO RELATED APPLICATIONS

This application claims the priority benefit of French Patent Application No. 2112953, filed on Dec. 3, 2021, entitled "Surveillance du secteur", which is hereby incorporated by reference in its entirety.

TECHNICAL FIELD

The present disclosure generally concerns electronic devices and, more particularly, electronic devices implementing a mains monitoring.

BACKGROUND

Many known electronic devices are configured to be connected to the mains, to be electrically powered by the mains.

Mains monitoring enables these devices to obtain information relative to the mains, for example, the value of the mains voltage or a signal at a frequency which is a multiple of that of the mains, which are useful for the proper operation of these devices.

SUMMARY

For example, an embodiment provides an electronic device comprising an integrated circuit chip powered from the mains having the electronic device connected thereto, wherein the chip monitors the mains, for example, the voltage and/or the frequency of the mains, without for an input/output terminal of the chip to be dedicated to this monitoring.

An embodiment provides an electronic device comprising a rectifying circuit configured to be coupled to the mains and to deliver a rectified potential from the mains, and an integrated circuit chip comprising: a first input configured to receive the rectified potential and a second input configured to receive a reference potential; a first circuit coupling the second input to a first node itself coupled to the first input, the first circuit being configured to maintain the rectified potential at a constant value on the first input; at least one second circuit having a power supply input coupled to the first node; a first resistor series-connected to the first circuit between the second input and the first node, or connected between the first input and the first node; a third circuit connected across the first resistor and configured to deliver a signal which is an image of a current in the first resistor; and a fourth circuit configured to determine a mains frequency and/or a mains voltage based at least on the image signal of the current in the first resistor.

According to an embodiment, the first circuit is a shunt voltage regulator.

According to an embodiment, the first resistor is a shunt resistor.

According to an embodiment, the voltage rectifying circuit comprises a first terminal configured to deliver the rectified potential, the first terminal being connected to the first input of the chip, the voltage rectifying circuit further comprising a second terminal configured to be at the reference potential.

According to an embodiment, the device further comprises a capacitive element connected between the first and second terminals of the voltage rectifying circuit.

According to an embodiment, the fourth circuit is configured to determine the mains voltage from, further, an affine relation between the mains voltage and a current drawn by the chip on the first input.

According to an embodiment, the affine relation is of $A \cdot I + B$ type, A being a proportionality coefficient determined by an impedance series-connected to the voltage rectifying circuit between two input terminals of the device configured to be connected to the mains, B a constant determined by a voltage drop in the voltage rectifying circuit and by the constant value, and I the current drawn by the chip on its first input.

According to an embodiment, the impedance is previously known.

According to an embodiment, the fourth circuit is configured to determine the mains frequency based at least on a frequency of the image signal.

According to an embodiment, the fourth circuit is configured to deliver a signal at the frequency of the image signal.

According to an embodiment, the first resistor is series-connected to the first circuit between the second input and the first node, and the first node is connected to the first input.

According to an embodiment, the power supply input of the at least one second circuit is connected to the first node and to the first input.

According to an embodiment: the chip comprises a second resistor, for example, a second shunt resistor, connected between the first node and a second node of the chip; the power supply input of the at least one second circuit is connected to the second node; and the chip comprises a fifth circuit connected across the second resistor and configured to deliver a signal which is an image of the current in the second resistor.

According to an embodiment, the fourth circuit is configured to determine the mains voltage and/or the mains frequency based, further, on the image signal of the current in the second resistor.

According to an embodiment, the first resistor is connected between the first input and the first node, the power supply input of the at least one second circuit being connected to the first node.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Figure 1:
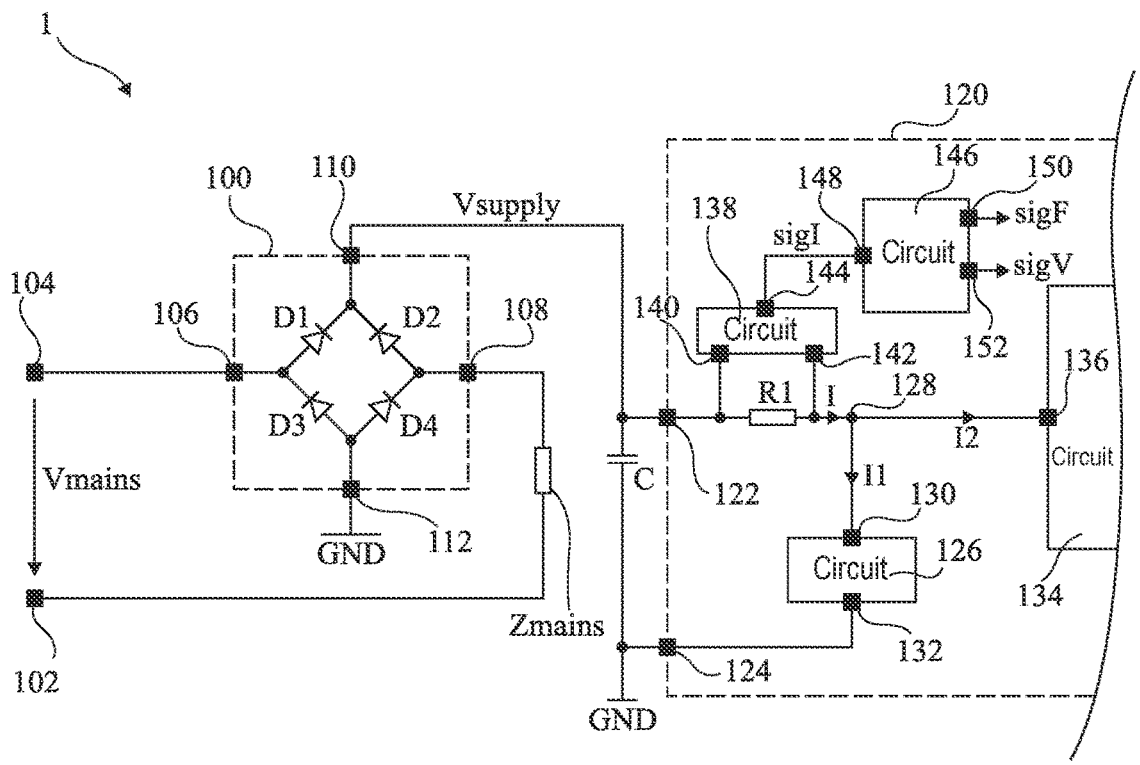
FIG. 1 schematically shows in the form of blocks an embodiment of an electronic device implementing a mains monitoring.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Many devices powered by the mains comprise a rectifying circuit configured to deliver a rectified potential from the mains, and an integrated circuit chip powered with the rectified potential. In these devices, the integrated circuit chip comprises a shunt voltage regulator or shunt regulator. This regulator is configured to impose a constant power supply potential on a first input terminal of the chip, by conducting more or less current from this first terminal to a second input/output terminal of the chip set to a reference potential. As an example, a shunt regulator comprises one or a plurality of Zener diodes.

In such devices comprising a shunt regulator, it is here provided to monitor the mains, for example to determine the mains voltage and/or the mains frequency, by monitoring the current drawn by the chip on its first terminal. This monitoring of the current is directly implemented in the chip. For example, this monitoring of the current is implemented by a shunt resistor coupled to a current sensor. The current sensor is configured to measure the current flowing through the shunt resistor, that is, to deliver a signal which is an image of the current flowing through the shunt resistor. Indeed, the current drawn by the chip on its first input terminal, and thus the image signal of this current, are linked by an affine relation to the mains voltage.

It is thus possible to obtain or determine the mains voltage and/or the mains frequency based on the current monitored in the chip, for example based respectively on the value of the image signal and/or on the frequency of the image signal of this current.

Thus, it is not necessary to provide an input terminal of the chip which is dedicated to mains monitoring, for example, an input terminal which would be coupled to the mains, for example, to the phase line of the mains, by a voltage dividing bridge.

In an embodiment, a device includes a rectifying circuit delivering a rectified potential from the mains, and an integrated circuit chip that includes: a first input receiving the rectified potential and a second input receiving the ground; a first circuit coupling the second input to a first node coupled to the first input, the first circuit maintaining the rectified potential constant; a resistor series-connected with the first circuit between the second input and the first node; a circuit delivering a signal which is an image of a current in the resistor; and a circuit determining a mains frequency and/or a mains voltage based on the image signal.

FIG. 1 schematically shows in the form of blocks an embodiment of an electronic device 1 implementing a mains monitoring.

Electronic device or system 1 comprises a rectifying circuit 100. Circuit 100 is configured to be coupled to the mains and to deliver a rectified potential Vsupply. In other words, circuit 100 is configured to receive the AC voltage Vmains of the mains and to deliver potential Vsupply from this voltage Vmains.

As an example, device 1 comprises two input terminals 102 and 104 configured to be coupled or connected to the mains. For example, when terminals 102 and 104 are respectively coupled or connected to the phase and to the neutral of the mains, voltage Vmains is then available on terminal 102 and is referenced to the potential on terminal 104. As an example, rectifying circuit 100 comprises a terminal 106 coupled, for example connected, to terminal 104 and a terminal 108 coupled, for example, connected, to terminal 102.

As an example, circuit 100 further comprises a terminal 110 configured to deliver rectified potential Vsupply, and a terminal 112 configured to be at a reference potential, for example, ground GND. Terminal 112 is for example configured to receive reference potential GND. Potential Vsupply is referenced to potential GND and is for example positive with respect to potential GND.

According to an embodiment, rectifying circuit 100 is series-connected with an impedance Zmains between terminals 102 and 104. As an example, impedance Zmains comprises a resistor and, optionally, a capacitive element. Although, in FIG. 1, impedance Zmains is connected between terminals 108 and 102, as a variant, impedance Zmains may be connected between terminals 104 and 106. In still another variant, a portion of impedance Zmains, for example, resistive, is connected between terminals 104 and 106 and the other portion of impedance Zmains, for example, capacitive, is connected between terminals 108 and 102.

The value of impedance Zmains is previously known and is considered as constant. The value of impedance Zmains may be adapted to the considered mains, for example, to the case where the mains is supposed to deliver a 230-V rms. voltage at a 50-Hz frequency or in the case where the mains is supposed to deliver a 110-V rms. voltage at 60 Hz, it being understood that the mains may correspond to other rms. voltage-frequency pairs. As an example, $$Z_{mains} = \sqrt{R_{mains}^2 + \frac{1}{(2\pi \cdot f \cdot C_{mains})^2}},$$

Rmains being the value of the resistive component of impedance Zmains, f the mains frequency, and Cmains the value of the capacitive component of impedance Zmains. When impedance Zmains comprises no capacitive component, Cmains is equal to zero.

Circuit 100 is preferably a passive circuit, that is, a circuit comprising no component, such as a transistor, which requires a control signal delivered by a control circuit so that circuit 100 can implement its voltage rectification function. In other words, circuit 100 is, preferably, a passive circuit which does not require receiving a control signal.

According to an embodiment, circuit wo is a voltage rectifying bridge comprising four diodes D1, D2, D3, and D4, although, in another embodiment, circuit 100 may comprise a single diode or a single diode half-bridge. As an example, diode D1 has its anode connected to terminal 106 and its cathode connected to terminal no, diode D2 has its anode connected to terminal 108 and its cathode connected to terminal 106, diode D3 has its anode connected to terminal 112 and its cathode connected to terminal 106, and diode D4 has its anode connected to terminal 112 and its cathode connected to terminal 108.

Device 1 further comprises an integrated circuit chip 120. Chip 120 is for example an application-specific integrated circuit (ASIC). Chip 120 may be implemented monolithically on a single semiconductor substrate, such as a silicon substrate.

Although this is not illustrated in FIG. 1, the number of input(s)/output(s) of chip 120 enabling it to exchange signals with the outside of chip 120 is limited, this number for example being smaller than or equal to eight. Further, although this is not illustrated in FIG. 1, chip 120 is in practice encapsulated in a package only leaving access to the input(s)/output(s) of chip 120. For example, the package comprising chip 120 is assembled on a connection support, for example, a printed circuit, having circuit wo and impedance Zmains also assembled thereon, the support enabling to connect together chip 120, circuit 100, and impedance Zmains.

Chip 120 comprises an input 122 configured to receive rectified potential Vsupply and an input 124 configured to receive reference potential GND. The potential difference between the inputs 122 and 124 of chip 120 enables to electrically power chip 120, that is, the integrated circuits that it comprises.

As an example, inputs 122 and 124 are connected to rectifying circuit 100. For example, input 122 is connected to the terminal no of circuit 100 to receive potential Vsupply. For example, input 124 is connected to terminal 112.

Device 1 comprises a capacitive element C connected between the inputs 122 and 124 of chip 120 or, in other words, between the terminals 110 and 112 of rectifying circuit 100. Preferably, capacitive element C is arranged outside of chip 120. Element C is for example configured to smooth or filter potential Vsupply on the input 122 of chip 120.

Chip 120 further comprises a circuit 126 coupling an inner node 128 of chip 120 to the input 124 of chip 120. Node 128 is coupled to the input 122 of chip 120.

Circuit 126 is configured to maintain potential Vsupply at a constant value Vcc on the input 122 of chip 120. As an example, value Vcc is substantially equal to 3.3 V.

For example, circuit 126 comprises a terminal 130 coupled or connected to node 128 and a terminal 132 coupled or connected to input 124. Circuit 126 is configured to maintain a constant potential difference, for example, equal to Vcc, between its terminals 130 and 132, that is, a constant potential on node 128.

In the embodiment illustrated in FIG. 1, terminals 130 and 132 are for example respectively connected to node 128 and to input 124.

Circuit 126 is a shunt voltage regulator or shunt regulator. In other words, circuit 126 is configured to maintain the potential of node 122 at a constant value, by drawing more current when the potential of node 122 increases, or tends to increase, above this constant value, and by drawing less current when the potential of node 122 decreases, or tends to decrease, below this constant value. For example, circuit 126 is configured to maintain potential Vsupply at set point value Vcc by increasing the current drawn by circuit 126 from node 122 when potential Vsupply increases above value Vcc, and to decrease the current drawn by circuit 126 from node 122 when potential Vsupply decreases below value Vcc.

As an example, circuit 126 comprises at least one Zener diode connected between terminals 130 and 132. As another example, circuit 126 comprises a circuit called shunt voltage reference. An example of a shunt voltage reference is designated by reference TL431, it being understood that, if circuit 126 is implemented identically to circuit TL431, the components of circuit 126 are integrated components of chip 120.

Chip 120 comprises a circuit 134, for example, a microcontroller, configured to be powered with potential Vsupply. In other words, circuit 134 comprises an input 136, called power supply input, coupled or connected to the input 122 of chip 120. More particularly, input 136 is coupled to node 128, itself coupled to input 122.

Although in the example of FIG. 1, chip 120 comprises a single circuit 134 powered with potential Vsupply, chip 120 may comprise more than one circuit powered with potential Vsupply. Each circuit of chip 120 which is powered with potential Vsupply has, for example, a power supply input coupled or connected to node 128.

Chip 120 further comprises a resistor R1. Resistor R1 is a shunt resistor.

In the embodiment illustrated in FIG. 1, resistor R1 is connected between input 122 and node 128. In other words, in this embodiment, resistor R1 is arranged in chip 120 so that a current I drawn by chip 120, for example, by circuit 134 and regulator 126, on the input 122 of chip 120 flows through resistor R1. Still in other words, in this embodiment, the power supply input of the circuits of chips 120 powered with potential Vsupply is connected to node 128 and is thus coupled to input 122 by resistor R1.

Thus, in the embodiment illustrated in FIG. 1, the voltage across resistor R1 is determined by the value of resistance R1 and by the value of current I.

Chip 120 further comprises a circuit, or current sensor, 138 connected across resistor R1. In other words, circuit 138 is connected in parallel with resistor R1. As an example, circuit 138 has a terminal 140 connected to a first terminal of resistor R1, for example connected to input 122 in the embodiment of FIG. 1, and a terminal 142 connected to a second terminal of resistor R1, for example connected to node 128.

Circuit 138 is configured to deliver a signal sigI, for example, a voltage, which is an image of the current flowing through resistor R1, that is, current I in the embodiment of FIG. 1.

It is here considered that a signal which is an image of a current in a resistor is a signal which varies along with the variations of this current, for example, a signal having its value changing proportionally to the changes of value of the current in the resistor.

Thus, when the current in resistor R1 varies periodically, image signal sigI also periodically varies, with the same period as the current in resistor R1. Further, when the current in resistor R1 exhibits a given value variation, signal sigI exhibits a corresponding value variation, proportional to the variation of the value of the current in resistor R1. In other words, image signal sigI is representative of the value and of the frequency of the current I in resistor R1.

As an example, signal sigI is available on an output terminal 144 of circuit 138. As an example, circuit 138 comprises an operational amplifier, for example, an operational amplifier having a first input coupled to terminal 14o, having a second input coupled to terminal 142, and having an output coupled or connected to terminal 144.

Current I flows from input 122 to node 128. At the level of node 128, a portion I1 of current I is deviated through circuit 126, the other portion I2 of current I being delivered to the circuits of chip 120 powered with potential Vsupply, for example, to circuit 134. In other words, the current I drawn from input 122 is equal to the sum of currents I1 and I2, I1 being the current flowing through regulator 126 and I2 the power supply current of the circuits of chip 120 powered with potential Vsupply.

Chip 120 further comprises a circuit 146. Circuit 146 is configured to determine, at least based on signal sigI, the mains frequency and/or the mains voltage Vmains. In other words, circuit 146 is configured to obtain the mains frequency, that is, for example, to deliver a signal having a frequency proportional to mains frequency f, and/or to determine or calculate the value of mains voltage Vmains, that is, for example, to deliver a signal having a value proportional to the value of voltage Vmains.

As an example, when circuit 146 is configured to determine mains voltage Vmains, this enables circuits of chip 120, for example, circuit 134, to verify, for at least a given range of voltage values, whether voltage Vmains belongs or not to this range of values. This for example enables to detect whether voltage Vmains is contained in a range of values for which device 1 is configured to operate according to a first operating mode, for example, a nominal operating mode. This also enables, optionally, to detect whether voltage Vmains belongs to a range of values for which device 1 does not operate properly, or to a range of values for which device 1 is configured to operate according to a second operating mode, for example, a degraded operating mode.

As an example, when circuit 146 is configured to determine the mains frequency, that is, to generate a signal at a frequency proportional to the mains frequency, this enables chip 120, for example, its circuit 134, to implement synchronizations on a real time clock.

As an example, circuit 146 comprises a terminal 148 configured to receive signal sigI.

As an example, circuit 146 comprises a terminal 150 configured to deliver a signal sigF, for example, a binary signal, at a frequency which is a multiple of mains frequency f or equal to mains frequency f. As an example, circuit 146 comprises a comparator, for example, a D flip-flop, configured to deliver signal sigF based on signal sigI or based on a signal corresponding to signal sigI, amplified.

As an example, circuit 146 comprises a terminal 152 configured to deliver a signal sigV indicating the value of voltage Vmains. As an example, circuit 146 comprises an analog-to-digital converter delivering signal sigV based on signal sigI. As another example, circuit 146 comprises a direct connection between terminal 148 and terminal 152, signals sigV and sigI then being identical.

Advantage is here taken from the fact that current I and voltage Vmains are linked together by an affine relation. Thus, knowing current I due to resistor R1 and to circuit 138 enables circuit 146 to know mains voltage Vmains and mains frequency f.

According to an embodiment, the affine relation can be written as Vmains=A·I+B, A being a coefficient and B a constant. Coefficient A is determined by impedance Zmains. Constant B is determined by the voltage drop in circuit wo and by the constant value Vcc of potential Vsupply. For example, for a voltage drop in circuit wo equal to 1.2 V, one has $$V_{mains} = \frac{Z_{mains} \cdot I + V_{CC} + 1.2}{\sqrt{2}}.$$

An advantage of device 1 is that, to monitor the mains, and in particular to determine the mains frequency and/or voltage, it is not necessary to reserve an input of chip 120 which would be dedicated to this mains monitoring, and which would for example be coupled to terminal 102 via a voltage dividing bridge. Indeed, reserving an input of chip 120 for mains monitoring decreases the number of inputs of chip 1 likely to be used for other functionalities and, further, requires providing a protection against overvoltages on this reserved input. In device 1, the input 122 of chip 120 which is provided to receive the electric power supply Vsupply of chip 120 is used again.

In the embodiment of FIG. 1, in practice, circuit 126 is more exactly configured to impose a constant potential equal to Vcc on node 128. However, the voltage drop in resistor R1 is neglected and potential Vsupply is considered as equal to Vcc.

Figure 2:
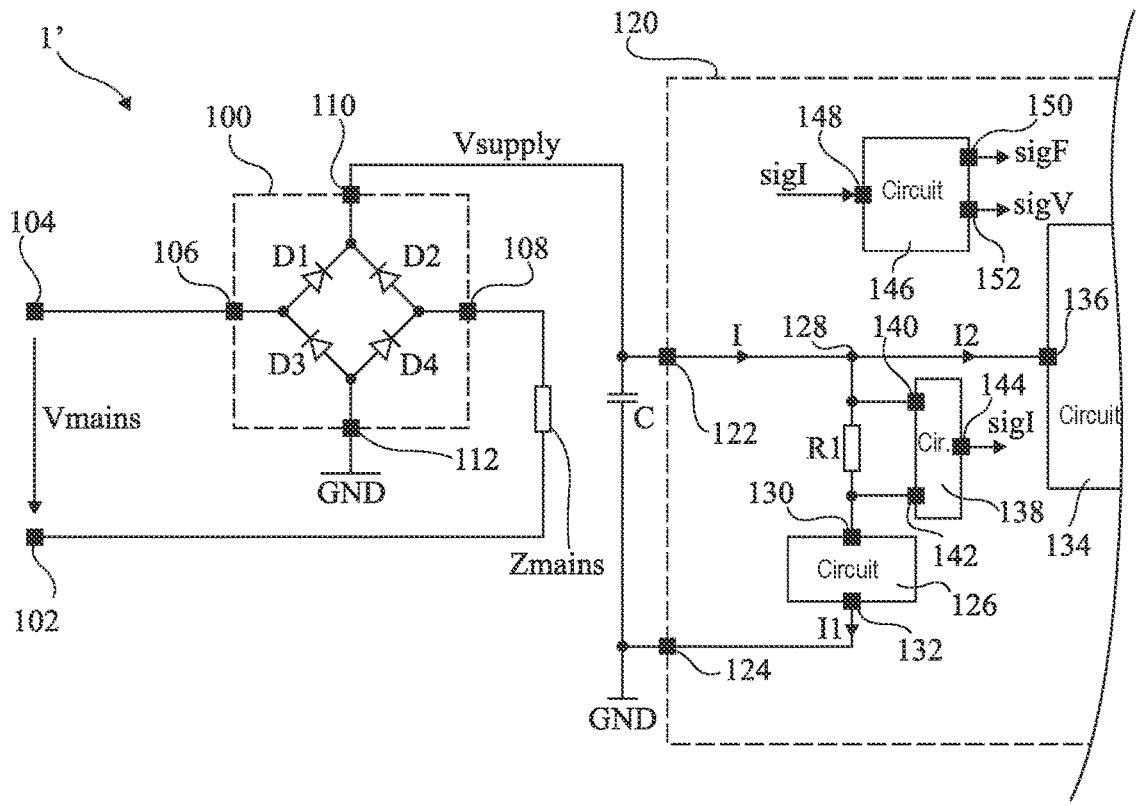
FIG. 2 schematically shows in the form of blocks another embodiment of an electronic device implementing a mains monitoring.

FIG. 2 schematically shows in the form of blocks another embodiment of an electronic device 1' implementing a mains monitoring.

Device 1' comprises a very large number of elements in common with the device 1 described in relation with FIG. 1, and only the differences between these two devices 1 and 1' are here highlighted.

In the embodiment of FIG. 2, it is considered that the current I2 drawn from 128 by the circuits of chip 120 to be powered, for example, the current I2 drawn by circuit 134 in the example of FIG. 2, is negligible as compared with current I1. In other words, it is considered that current I is equal to current I1. As an example, current I2 is considered as negligible as compared with current I1 when the average of current I2 is smaller than or equal to 10% of the average of current I1.

Thus, in this embodiment, rather than connecting resistor R1 between input 122 and node 128 so that current I flows therethrough as in device 1, the resistor R1 of the chip 120 of device 1' is series-connected with circuit 126, between node 128 and input 124, so that current I2 flows through resistor R1. In other words, in device 1', resistor R1 is arranged in chip 120 so that the current flowing through resistor R1 is equal to the current I1 flowing through circuit 126. Still in other words, in the device 1' of FIG. 2, the voltage across resistor R1 is determined by the value of resistance R1 and by current I1.

As an example, as illustrated in FIG. 2, resistor R1 has a terminal connected to node 128 and a terminal connected to circuit 126, for example, to the terminal 130 of circuit 126. The terminal 132 of circuit 126 is then, for example, connected to input 124. Further, node 128 is then for example connected to input 122.

In another example, not illustrated, resistor R1 may be connected between input 124 and circuit 126, for example, between input 124 and the terminal 132 of circuit 126, the terminal 130 of circuit 126 then being, for example, connected to node 128.

In the example of FIG. 2, the power supply input of the circuits of chip 120 powered by potential Vsupply, for example the input 136 of circuit 134, is connected to node 128, and thus to input 122.

As in device 1, circuit 138 is connected across resistor R1 or, in other words, in parallel with resistor R1. In the example of FIG. 2, the terminal 140 of circuit 138 is connected to a first terminal of resistor R1 connected to node 128, and the terminal 142 of circuit 138 is connected to a second terminal of resistor R1 connected to circuit 126, for example, to the terminal 130 of circuit 126.

In the same way as in device 1, the circuit 146 of device 1' is configured to determine or deliver the value of voltage Vmains and/or mains frequency f, based at least on the signal sigI delivered by circuit 138. As an example, current I1 is linked to voltage Vmains by the same affine relation as that described in relation with FIG. 1, by replacing current I with current I1 in this relation when current I2 is considered as negligible as compared with current I1.

According to an alternative embodiment of device 1', current I2 is not considered as negligible as compared with current I1. In this case, current I may be approximated by current I1 incremented by a constant. For example, this constant is determined during a phase of characterization of device 1', and corresponds, for example, to the average value of the current I2 of device 1' in operation. In other words, current I2 may be approximated by a constant value, and current I is then equal to current I1 determined based on signal sigI and on current I2 equal to the previously-known constant.

According to an alternative embodiment, current I2 is considered as negligible as compared with current I1 when circuit 134 is at stand-by and is not considered as negligible as compared with current I1 when circuit 134 is in operation. In the case where current I2 is not negligible as compared with current I1, current I2 is approximated by a constant value, for example, similarly to what has been indicated hereabove. For example, circuit 134 is a microcontroller which is at standby when it executes no instruction and which is active when it executes instructions, for example to process an event having had the microcontroller pass from the standby state to the active state.

As compared with device 1, device 1' does not exhibit a voltage drop linked to the presence of resistor R1 between input 122 and the power supply input of the circuits of chip 120 powered with potential Vsupply. For example, device 1' does not exhibit a voltage drop linked to resistor R1 between input 122 and the power supply input 136 of circuit 134.

However, the determination of voltage Vmains performed by device 1' is less accurate than that performed by device 1. This results from the fact that, in the device 1' of FIG. 2, to determine current I based on the signal sigI image of current I1, current I2 is neglected or approximated by a constant.

Figure 3:
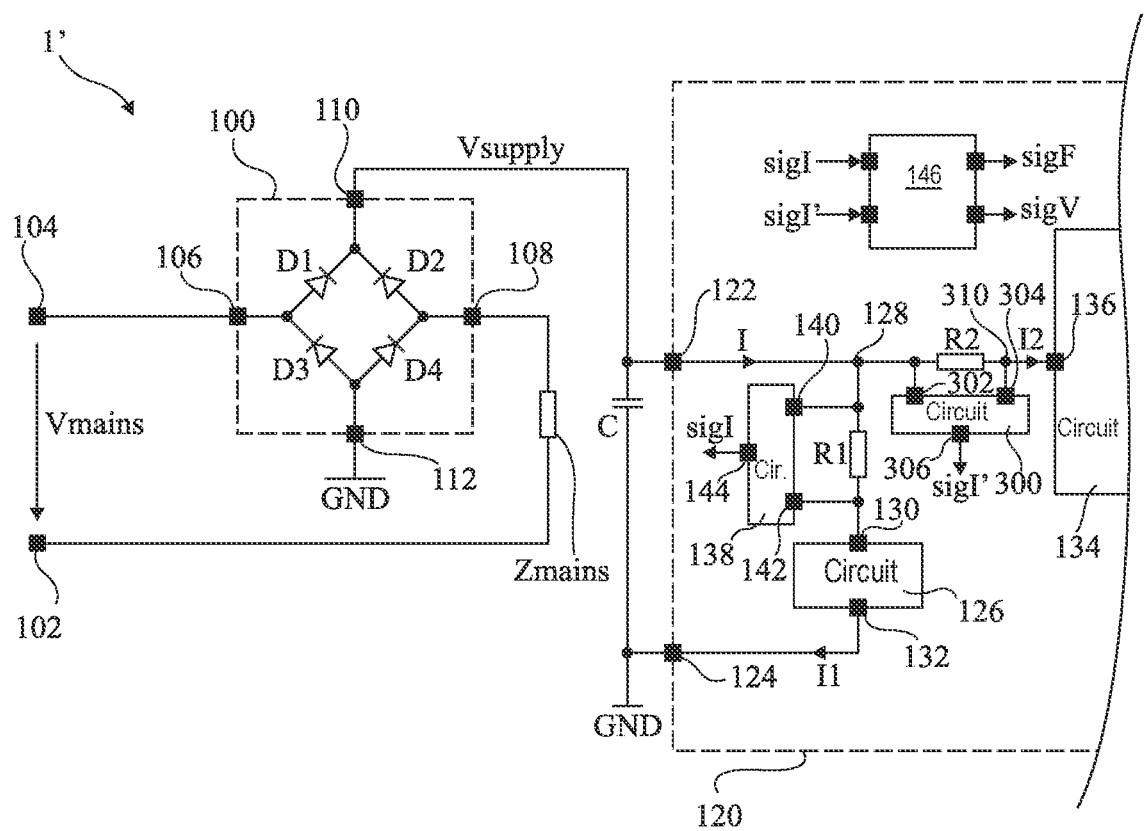
FIG. 3 schematically shows in the form of blocks an alternative embodiment of the electronic device of FIG. 2.

FIG. 3 schematically shows in the form of blocks an alternative embodiment of the electronic device 1' of FIG. 2.

Only the differences between the device 1' of FIG. 2 and that of FIG. 3 are here highlighted.

The device 1' of FIG. 3 differs from that of FIG. 2 in that it comprises, in addition to resistor R1 and to circuit 138, a resistor R2 and a circuit 300.

Resistor R2 is arranged in chip 120 so that current I2 flows therethrough, current I2 being the current drawn by the circuits of chip 120 powered with potential Vsupply. For example, resistor R2 is connected between node 128 and an inner node 310 of chip 120, the power supply input of the circuits of chip 120 powered with potential Vsupply for example being connected to node 310. For example, in FIG. 3, the input 136 of circuit 134 is connected to node 310. In other words, the power supply input of the chip circuits powered with potential Vsupply is connected to node 310, to be coupled to input 122 by resistor R2.

Circuit or current sensor 300 is connected across resistor R2. In other words, circuit 300 is connected in parallel with resistor R2. As an example, circuit 300 has a terminal 302 connected to a first terminal of resistor R2, for example, connected to node 128 in the embodiment of FIG. 3, and a terminal 304 connected to a second terminal of resistor R2, for example, connected to node 310 in the embodiment of FIG. 3.

Circuit 300 is configured to deliver a signal sigI', for example, a voltage, which is an image of the current I2 flowing through resistor R2. In other words, image signal sigI' is representative of the value of current I2 in resistor R2.

As an example, signal sigI' is available on an output terminal 306 of circuit 300. As an example, circuit 300 comprises an operational amplifier, for example, an operational amplifier having a first input coupled to terminal 302, having a second input coupled to terminal 304, and having an output coupled or connected to terminal 306.

In this alternative embodiment of device 1', circuit 146 is configured to determine mains voltage Vmains and/or the mains frequency not only based on the signal sigI image of current I1, but also based on the signal sigI' image of current I2.

For example, signals sigI and sigI' enable to determine the value of respective currents I1 and I2, and thus the value of current I based on which the value of voltage Vmains is determined, for example, by using the affine relation previously described in relation with FIG. 1.

As compared with the embodiment of FIG. 2, the alternative embodiment described in relation with FIG. 3 enables to more accurately determine voltage Vmains. This results from the fact that, in the variant of FIG. 3, current I2 is neither considered as negligible as compared with current I1, nor approximated by a previously-determined constant value, but is accurately known due to signal sigI'.

For example, when current I2 exhibits an abrupt increase resulting in current I1 becoming zero or next to zero, circuit 146 remains capable of determining mains frequency f or, in other words, of delivering signal sigF. Indeed, in such a case, current I2 then varies with the same frequency as current I, which is proportional to mains frequency f, and circuit 146 can determine mains frequency for deliver signal sigF based on signal sigI'. Conversely, when such a case occurs in the device 1' of FIG. 2, circuit 146 may no longer be able to deliver signal sigF.

As an example, although this has not been shown in FIGS. 1 to 3, a protection against overvoltages, or TVS, for "transient voltage suppressor", may be connected between the inputs 122 and 124 of chip 120 to protect chip 120 from the overvoltages of potential Vsupply. Such overvoltages for example occur when circuit 126 is no longer able to maintain potential Vsupply at constant value Vcc, for example, due to an overvoltage on voltage Vmains.

Further, although in FIGS. 1 to 3, devices 1 and 1' are configured to determine or obtain the value of voltage Vmains and the mains frequency, in alternative embodiments, devices 1 and 1' may be configured to only determine the value of voltage Vmains, signal sigF then being omitted, or to only determine the mains frequency, signal sigV then being omitted.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove. In particular, regarding the selection of the value of the shunt resistor(s), it will be within the abilities of those skilled in the art to select a value or values resulting in a voltage drop across the shunt resistor which is considered as negligible, that is, which does not modify the operation of chip 120 with respect to the case where this resistor would be absent. More generally, it will be within the abilities of those skilled in the art, based on the functional indications given hereabove, to implement each of the previously-described circuits 126, 138, 146, and 300.

What is claimed is:

1. An electronic device comprising:
a rectifying circuit configured to be coupled to a mains and to deliver a rectified potential from the mains, and
an integrated circuit chip comprising:
a first input configured to receive the rectified potential and a second input configured to receive a reference potential;
a first circuit coupled between the second input to a first node, wherein the first node is coupled to the first input, and the first circuit is configured to maintain the rectified potential at a constant value on the first input;
a second circuit having a power supply input coupled to the first node;
a first resistor series-connected to the first circuit between the second input and the first node, or connected between the first input and the first node;
a third circuit connected across the first resistor and configured to deliver a signal which is an image of a current in the first resistor; and
a fourth circuit configured to determine a mains frequency and/or a mains voltage based at least on the signal which is the image of the current in the first resistor.

2. The device according to claim 1, wherein the first circuit is a shunt voltage regulator.

3. The device according to claim 1, wherein the first resistor is a shunt resistor.

4. The device according to claim 1, wherein the rectifying circuit comprises a first terminal configured to deliver the rectified potential, wherein the first terminal is connected to the first input of the chip, and the rectifying circuit further comprises a second terminal configured to be at the reference potential.

5. The device according to claim 4, wherein the device further comprises a capacitive element connected between the first and second terminals of the rectifying circuit.

6. The device according to claim 1, wherein the fourth circuit is configured to determine the mains voltage based on an affine relation between the mains voltage and a current drawn by the chip on the first input.

7. The device according to claim 6, wherein the affine relation is of an $A \cdot I + B$ type, wherein A is a proportionality coefficient determined by an impedance series-connected to the rectifying circuit between two input terminals of the device configured to be connected to the mains, B is a constant determined by a voltage drop in the rectifying circuit and by the constant value, and I is the current drawn by the chip on its first input.

8. The device according to claim 7, wherein a value of the impedance is previously known.

9. The device according to claim 1, wherein the fourth circuit is configured to determine the mains frequency based at least on a frequency of the image signal.

10. The device according to claim 1, wherein the fourth circuit is configured to deliver a signal at a frequency of the image signal.

11. The device according to claim 1, wherein:
the first resistor is series-connected with the first circuit between the second input and the first node; and
the first node is connected to the first input.

12. The device according to claim 11, wherein the power supply input of the second circuit is connected to the first node and to the first input.

13. The device according to claim 11, wherein:
the chip comprises a second resistor connected between the first node and a second node of the chip;
the power supply input of the second circuit is connected to the second node; and
the chip comprises a fifth circuit connected across the second resistor and configured to deliver a signal which is an image of a current in the second resistor.

14. The device according to claim 13, wherein the fourth circuit is configured to determine the mains voltage and/or the mains frequency based on, further, the signal which is the image of the current in the second resistor.

15. The device according to claim 1, wherein the first resistor is connected between the first input and the first node, the power supply input of the second circuit being connected to the first node.

16. An integrated circuit chip comprising:
a first power supply input configured to receive a rectified portion of a mains signal via a first pin of the integrated circuit chip and a reference input configured to receive a reference potential via a second pin of the integrated circuit chip;
a functional circuit having a second power supply input coupled to the first power supply input, wherein power to the functional circuit is configured to be supplied via the second power supply input;
a voltage regulator coupled between the reference input and the first power supply input;
a measurement resistor, wherein the measurement resistor is coupled in series with the voltage regulator between the reference input and the first power supply input or is coupled between the first power supply input and the second power supply input of the functional circuit;
a current measurement circuit coupled to the measurement resistor and configured to provide a current measurement signal indicative of a current flowing through the measurement resistor; and
a mains calculation circuit coupled to the current measurement circuit, the mains calculation circuit configured to determine a frequency or a voltage of the mains signal based on the current measurement signal.

17. The integrated circuit chip of claim 16, wherein the mains calculation circuit is configured to determine the voltage of the mains signal based on an affine relation between a voltage of the mains signal and a current drawn by the chip at the first power supply input.

18. The integrated circuit chip of claim 17, wherein the affine relation is of an $A \cdot I + B$ type, wherein A is a proportionality coefficient based on an impedance series-connected to a rectifying circuit configured to provide the rectified portion of a mains signal, B is a constant determined by a voltage drop in the rectifying circuit and by a voltage provided by the voltage regulator, and I is the current drawn by the chip at the first power supply input.

19. A method of determining a voltage or frequency of a mains signal, the method comprising:
rectifying a mains signal to provide a rectified mains signal;
receiving the rectified mains signal at a first power supply input via a first pin of an integrated circuit;

receiving a reference voltage at a reference node via a second pin of the integrated circuit;

receiving, by a functional circuit, power from the first power supply input via a second power supply input of the functional circuit;

providing, by a voltage regulator coupled between the first power supply input and the reference node, a regulated voltage at a first node of the integrated circuit;

measuring a current flowing through a measurement resistor, wherein the measurement resistor is coupled in series with the voltage regulator between the reference node and the first power supply input or is coupled between the first power supply input and the second power supply input of the functional circuit; and calculating a frequency or a voltage of the mains signal based on the measured current.

20. The method of claim 19, wherein calculating the frequency or voltage of the mains signal comprises calculating the frequency or voltage based on an affine relation between the voltage of the mains signal and a current drawn by the integrated circuit at the first power supply input.

* * * * *

UNITED STATES PATENT AND TRADEMARK OFFICE
CERTIFICATE OF CORRECTION

PATENT NO. : 12,158,483 B2
APPLICATION NO. : 18/053974
DATED : December 3, 2024
INVENTOR(S) : Christophe Lorin It is certified that error appears in the above-identified patent and that said Letters Patent is hereby corrected as shown below:

In the Claims

In Column 12, Line 52, Claim 17:
Change "between a voltage of the mains signal and a current drawn"
To --between the voltage of the mains signal and a current drawn--

In Column 12, Line 58, Claim 18:
Change "portion of a mains signal, B is a constant determined by"
To --portion of the mains signal, B is a constant determined by--

Signed and Sealed this
Twentieth Day of May, 2025

Coke Morgan Stewart
*Acting Director of the United States Patent and Trademark Office*